(12) United States Patent
Thery et al.

(10) Patent No.: US 6,897,558 B2
(45) Date of Patent: May 24, 2005

(54) POWER ELECTRONIC COMPONENT MODULE AND METHOD FOR ASSEMBLING SAME

(75) Inventors: Laurent Thery, Fontenay/s/Bois (FR); Brice Lecole, La Chapelle-St-Mesmin (FR)

(73) Assignee: Valeo Equipements Electriques Moteur, Creteil (FR)

( * ) Notice: Subject to any disclaimer, the term of this patent is extended or adjusted under 35 U.S.C. 154(b) by 0 days.

(21) Appl. No.: 10/398,481

(22) PCT Filed: Jul. 31, 2002

(86) PCT No.: PCT/FR02/02768

§ 371 (c)(1),
(2), (4) Date: Apr. 4, 2003

(87) PCT Pub. No.: WO03/017368

PCT Pub. Date: Feb. 27, 2003

(65) Prior Publication Data

US 2004/0012275 A1 Jan. 22, 2004

(30) Foreign Application Priority Data

Aug. 17, 2001 (FR) .......................................... 01 10912

(51) Int. Cl.[7] ........................................... H01L 23/053
(52) U.S. Cl. ...................... 257/700; 257/701; 257/702; 257/706; 257/707; 257/691; 257/723; 438/121; 438/122; 438/123
(58) Field of Search ............................. 257/700, 701, 257/702, 706, 707, 691, 723; 438/121, 122, 123

(56) References Cited

U.S. PATENT DOCUMENTS

| 4,305,088 | A | | 12/1981 | Narita et al. | |
|---|---|---|---|---|---|
| 5,446,318 | A | * | 8/1995 | Koike et al. | 257/707 |
| 5,471,089 | A | * | 11/1995 | Nagatomo et al. | 257/691 |
| 5,621,243 | A | * | 4/1997 | Baba et al. | 257/712 |
| 5,920,119 | A | * | 7/1999 | Tamba et al. | 257/718 |
| 6,541,838 | B1 | * | 4/2003 | Suetsugu et al. | 257/500 |
| 2001/0031345 | A1 | * | 10/2001 | Araki et al. | 428/209 |
| 2002/0066953 | A1 | * | 6/2002 | Ishiwata et al. | 257/700 |

FOREIGN PATENT DOCUMENTS

| DE | 27 55 404 | 6/1979 |
|---|---|---|
| EP | 0 791 961 A2 | 8/1997 |
| JP | A 59-108340 | 6/1984 |

* cited by examiner

Primary Examiner—Jasmine Clark
(74) Attorney, Agent, or Firm—Liniak, Berenato & White

(57) ABSTRACT

This electronic module comprises a metallic base (12) and electronic power components (D1, D2, D3, D4, D5, D6) on the base; in which each component, in a group consisting of some of the components, is mounted on the base with a respective electrically insulating and thermally conductive element (44) being interposed, the other components of the power module being connected electrically to the said base, and in which a peripheral frame (14) is mounted on the base and incorporates interconnecting elements of electrically conductive materials.

The invention is applicable in the field of motor vehicle alternators.

17 Claims, 3 Drawing Sheets

POWER ELECTRONIC COMPONENT MODULE AND METHOD FOR ASSEMBLING SAME

FIELD OF THE INVENTION

The present invention relates to an electronic module comprising electronic power components, and a method of assembling such a module.

More particularly, the invention relates to an electronic module of the type comprising a metallic base and electronic components mounted on the base, in particular as a rectifier bridge.

STATE OF THE ART

In a known arrangement, the electronic components from which this type of module is constructed are in the form of individually encapsulated silicon chips.

This type of technique considerably increases the size of the module and renders the components hard to interchange, because each component supplier supplies components of specific configuration.

In another known arrangement, which partially overcomes these drawbacks, all of the electronic power components in the module are mounted on the base. For electrical reasons, some of the electronic power components of the electronic module must be electrically insulated from the base. For this purpose a layer of electrically insulating material is interposed between the base and the said components that are to be insulated. In a known way, this insulating layer is common to all of the electronic components that have to be insulated. In some modules, all of the elements, including those that must be earthed, may be insulated.

In that case the components are generally in the form of unclad silicon chips, which are easy to interchange.

This method does however have a major inconvenience because it has a relatively high selling cost. In this connection, the electrical insulator is expensive. Because this insulator is common to all of the power components which have to be insulated from the base, the insulating portions situated between the electronic components are somewhat ineffective for evacuating heat given off by the components in operation.

In the document DE-A-2 755 404 in accordance with the preamble of claim 1, there is described an electronic module, comprising a metallic base and electronic power components mounted on the base. In a group consisting of some of the components, each component is mounted on the base with a respective element being interposed which is electrically insulating and thermally conductive, the other components being connected electrically to the said base.

In this way, the selling cost of the module is considerably reduced because the electronic components are individually insulated from the base, while evacuation of heat given off in operation of the components is improved.

Nevertheless, a problem is presented because the components are force-fitted into the base, in such a way that the arrangement of the components in the module cannot be optimised, and the interconnection between the components of the module is not simple to achieve.

SUMMARY OF THE INVENTION

An object of the present invention is to overcome these drawbacks in a simple and inexpensive way.

According to the invention, an electronic module of the type described above is characterised in that it includes a peripheral frame mounted on the base, and in that the frame incorporates interconnecting elements of electrically conductive materials.

Thanks to the invention, the interconnection between components is simple to achieve and the arrangement of the components in the module is optimised. In addition, the frame is simple to make and enables both the base and the insulating, thermally conductive element to be simplified. Moreover, stresses on the components are reduced because the latter are not force-fitted.

Interconnection with elements outside the module is also simple to make.

Thus, in one embodiment, the peripheral frame also incorporates interconnecting elements of electrically conductive materials in order to make an interconnection between the components of the module and elements outside the latter.

In an inexpensive embodiment, the peripheral frame is made by moulding in a plastics material, while the metallic connecting arms are moulded into the peripheral frame.

The moulding-in operation preferably provides apertures in the peripheral frame, such as to define zones of electrical contact on the said metallic arms.

The module can with advantage further include one or more of the following features, taken separately or in accordance with any technically possible combination:

At least the face of the insulating element that receives a respective component is coated with a metallic layer.

The metallic layer placed on the face of the insulating element which receives the component is connected to an electrical connecting terminal located in line with the base.

An intermediate support, of a material which is conductive to both heat and electricity, is interposed between each component of the said group of some components and a respective insulating element.

At least the face of the element that receives a component is connected to an electrical connecting terminal.

The other electronic components are mounted on the base with an intermediate support of electrically conductive material interposed.

The power components are provided with a connecting pad mounted on their top face, to which the conductors are connected so as to connect the components to the remainder of the circuit of the module.

The insulating element consists of an alumina wafer.

Each face of the alumina wafer is coated with a metallic coating.

The metallic layer located on each face of the alumina wafer is of copper.

The module further includes a peripheral frame and a protective cover, both mounted on the base, and the electronic components are encapsulated within a flexible protective resin.

The module further includes a peripheral frame mounted on the base and the components are encapsulated in a flexible resin which is coated with a layer of rigid protective resin.

The electronic power components consist of unclad silicon chips.

The invention also provides a method of assembly of an electronic module comprising electronic power components, which are in particular connected as a rectifier bridge for a motor vehicle alternator, on a metallic base, characterised in that it comprises the steps that consist of:

fixing each component between an intermediate support and electrical connecting pads;

fixing a first group of the components on the base;

fixing each component of a second group of the components on a respective element which is an electrical insulator and a conductor of heat, which is coated with at least one layer of electrically conductive material and which is applied on the base.

Preferably, subsequently to the fixing of the components on the base, there is fixed on the latter a peripheral frame of plastics material which incorporates electrical connecting means, and the connecting pads and the intermediate supports or the electrically conductive layer of the said element are connected to the electrical connecting means of the frame.

In a modified version, the said electrically insulating element is coated with a layer of metallic material which is fixed by brazing on the base.

In another modified version, the said electrically insulating material, coated with a layer of electrically conductive material, is adhesively bonded on the base.

In a further embodiment, the said electrically insulating element, coated with a layer of electrically conductive material, is fixed on the base by application of assembly pressure.

In yet another version, the said electrically insulating element coated with a layer of material which is electrically conductive is formed on the base by spraying an electrically insulating and thermally conductive material on the base and by depositing on the latter a layer of electrically conductive material.

The invention may be applied with advantage to a motor vehicle alternator comprising a rectifier bridge, a three-phase or six-phase stator, phases output from the stator being rectified by the rectifier bridge, essentially characterised in that the rectifier bridge consists of an electronic power module including the above mentioned technical features.

BRIEF DESCRIPTION OF THE DRAWINGS

Further objects, features and advantages will appear from the following description, which is given by way of non-limiting example only and with reference to the attached drawings, in which:

FIG. 1 shows a portion of a module of electronic power components according to the invention, designated by the general reference numeral 10.

DESCRIPTION OF EXAMPLES OF EMBODIMENTS OF THE INVENTION

Figure 1:
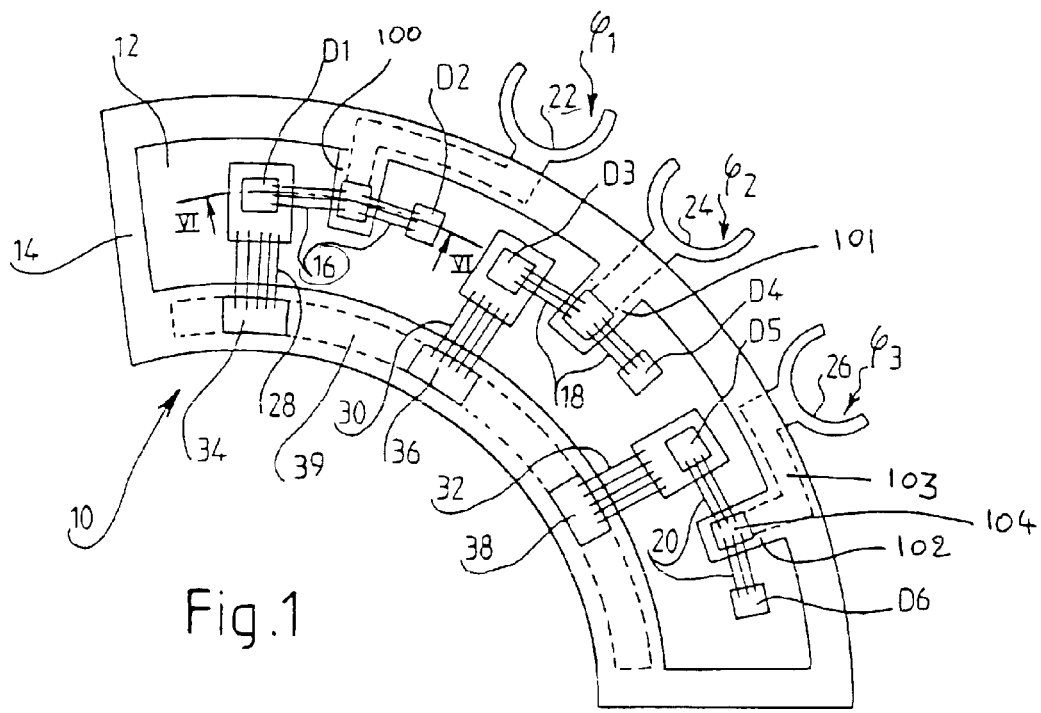
FIG. 1 is a diagrammatic top plan view of part of a module of electronic power components according to the invention.

The module 10 consists essentially of a base 12 made of an electrically conductive material appropriate to the intended application, being for example in copper, aluminium or steel, and on the outer periphery of which there is fixed a peripheral frame 14, and on which there are mounted electronic power components D1, D2, D3, D4, D5 and D6 in the form of silicon chips. The frame 14 is preferably of electrically insulating material, and is for example made by moulding an electrically insulating plastics material. It incorporates elements of electrically conductive material (for example copper or brass) for interconnection such as to make an interconnection between the components of the module and elements outside the latter. The frame is for example adhesively bonded on the base. The incorporation of the electrically conductive elements preferably consists in moulding metallic connecting arms into the frame. It will be appreciated that the base 12 is preferably flat, and that the electronic power components can easily be disposed on the latter.

The frame 14 extends into the interior of the base 12, to define, for example, three salient portions 100, 101 and 102 which contain the moulded-in arms 103 of connecting terminals 22, 24 and 26 respectively. The moulded-in arm 103 has a terminal zone 104 which is accessible from outside in order to make the electrical connection with conductors 16, 18 and 20.

Figure 2:
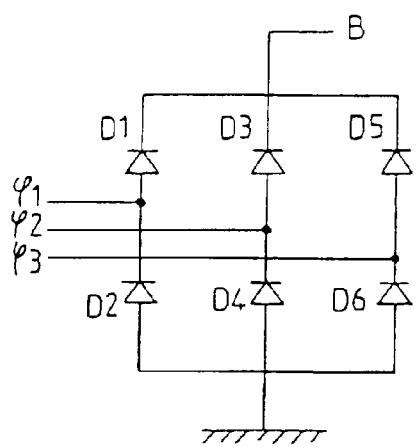
FIG. 2 shows the electronic structure of the circuit embodied by the portion of a module shown in FIG. 1.

As can be seen in FIG. 2, the electronic circuit formed by these components consists of a double alternating three-phase rectifier bridge.

Thus, the circuit is provided with three positive diodes, namely the diodes designated by the references D1, D3 and D5, together with three negative diodes, namely the diodes designated by the references D2, D4 and D6.

With this construction, the anode of the positive diodes D1, D3 and D5, together with the cathodes of the negative diodes D2, D4 and D6, are connected by means of the conductors 16, 18 and 20 to means for electrically connecting the module to a source of supply of alternating electrical energy, these means consisting of the three connecting terminals 22, 24 and 26 respectively which are supplied respectively from phases φ1, φ2 and φ3 of the supply source.

The said connecting terminals 22, 24 and 26 are incorporated by in situ moulding in the frame 14 during the moulding of the latter.

In the embodiment under consideration, in which the module is adapted to constitute a rectifier module for a motor vehicle alternator, the connecting terminals 22, 24 and 26 are connected to the outputs of the phases of the stator of the alternator. It is for this reason that the terminals have lugs for fastening the outputs of the phases by crimping.

The stator of the electrical machine, constituting in particular an alternator or an alternator starter, may be wound either with wires or with conductive bars which are preferably of a hairpin configuration, and which are located in slots in the stator. The windings thus produced may be of the three-phase or six-phase type. The conductors of the said hairpins are preferably aligned in the slots. For more details, reference should be made to French patent application No. 01 04770. Preferably, the electronic module is carried by the rear bearing which, in the known way, is part of the alternator.

As to the cathode of each of the positive diodes D1, D3 and D5, this is connected by means of conductors 28, 30 and 32 to terminals or pads 34, 36 and 38 for output of rectified current, which form part of a conductive track 39 which is incorporated, in accordance with the invention, in the frame 14, and which are locally exposed for the electrical connection of the said connectors. In the conventional way, the conductive track 39 is provided with a B+ terminal (not shown) on which the positive terminal of the battery of the vehicle is connected. The B+ terminal is connected to the conductive track 39 in a manner known per se, as for example in French patent application FR 00 08836 filed on Jun. 29, 2000. The track 39 consists in this example of a metallic strip moulded into the frame. The arms 39, 103 are interconnecting strips such that the strip makes the interconnection between the components.

Figure 3:
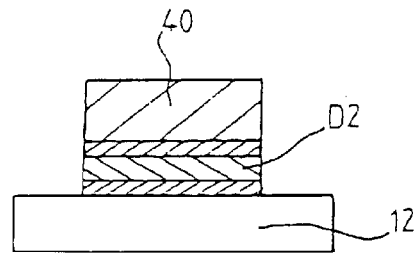
FIG. 3 shows diagrammatically the mounting of the negative diodes of the circuit in FIG. 2 on the base of the module according to the invention.

Referring now to FIG. 3, in which only one of the negative diodes D2 has been shown, in a first assembly mode, the negative diodes D2, D4 and D6 are directly fixed by brazing, or by means of an appropriate electrically conductive adhesive, on the base 12 in such a way that their anodes are electrically connected to the latter.

A connecting pad 40 of electrically conductive material, for example copper, is brazed with the aid of an electrically conductive adhesive on the top face of each negative diode, that is to say on their cathodes.

The same material is preferably used for mounting the connecting pads 40 on these diodes as for the mounting of the latter on the base 12.

Preferably, the pads 40 are made of a material which is a good conductor of heat and has a high calorific capacity, for example copper, and such as to permit storage and evacuation of heat produced by the diodes in the course of operation of the latter, in the event of a sharp increase in the voltage at their terminals.

Figure 4:
FIG. 4 shows a modified version of the mounting of the negative diodes in the circuit of FIG. 2 on the metallic base of the module according to the invention.

In another version, as can be seen in FIG. 4, in the event that the materials of which the negative diodes and base 12 are made have different coefficients of expansion, there is interposed between the latter an intermediate support element 42, which is for example of copper, so as to reduce the mechanical stresses imposed on the chips of the negative diodes, in particular in the case where the base 12 is made of aluminium.

Figure 5:
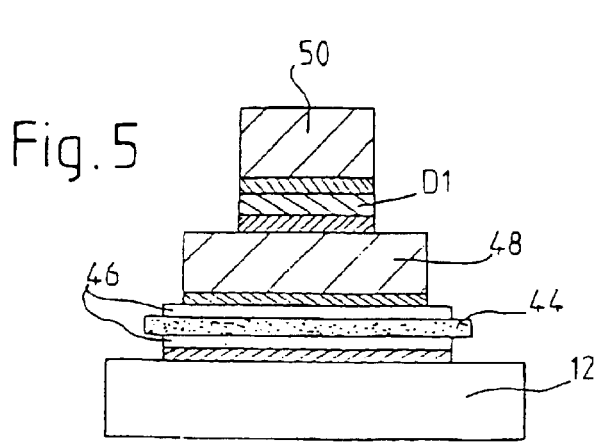
FIG. 5 shows diagrammatically the mounting of the positive diodes of the circuit in FIG. 2 on the base of the module according to the invention.

As regards the positive diodes D1, D3 and D5, with reference to FIG. 5 on which only the diode D1 is shown, each of these diodes is fixed on the base 12 with a respective element 44 interposed, the latter being an electrical insulator and a conductor of heat and being in the form of a wafer.

As will be understood, the components may be mounted on a single wafer or be mounted on respective separate wafers.

For example, this layer 44 is made of alumina. It is covered on at least one of its mutually opposed major faces with an electrically conductive metallic layer 46, which is for example of copper.

The alumina layer 44 may be brazed or adhesively bonded on the base. Where it is fixed by brazing, the conductive metallic layer 46 is necessary because alumina cannot be directly brazed.

However, any other appropriate technique may be used for depositing such a layer on the base. Thus it is possible to fix it for example by adhesive bonding using an electrically conductive or insulating adhesive, by application of an assembly pressure on the said wafer, or by spraying alumina, for example in the form of a plasma, on the base and then covering it with a copper layer.

An intermediate support element 48, made of a material which is a good conductor of heat and electricity, for example copper, and designed to improve the diffusion of heat when the vehicle is stationary and to ensure the thermal capacity function when the diode is subjected to transitory voltage peaks, is secured by adhesive bonding or brazing on the wafer 44, the latter being coated with layers 46 of electrically conductive material.

A chip D1 is then secured by brazing or adhesive bonding, with the aid of an electrically conductive adhesive, on the intermediate support 48 in such a way that it rests on the latter through its cathode.

It will be noted that, in the case where the positive chips D1 are brazed on the intermediate support 48, a method of brazing is preferably used in which the melting temperature is higher than that used for mounting the support 48 on the electrically insulating wafer.

Figure 6:
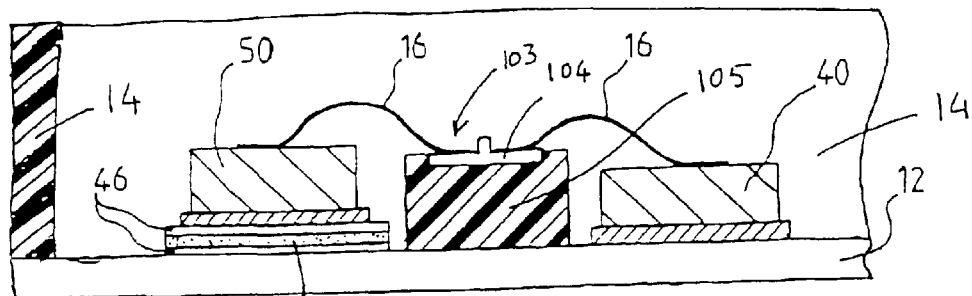
FIG. 6 is a view of the module of FIG. 1, in cross section taken on the line VI—VI and on a larger scale.

Finally, as in the embodiment described with reference to FIGS. 3 and 4, the upper face of each chip D1 is provided with an electrical connecting pad 50 to which the conductors 16, 18 and 20, for supplying power to the rectifier bridge (FIGS. 1 and 6) are connected.

After the components have been mounted on the base, the latter is furnished with a peripheral frame of plastics material which is provided with electrical connecting means.

These connecting means are then connected to the connecting pads 40 and 50 and to the intermediate supports 48 and metallic layer 46.

At the level of the terminal connecting zone 184, the salient portions 100, 101 and 102 preferably have an elevation 105 which enables the length of the conductors 16, 18 and 20 to be reduced by positioning the terminal connecting zone 107 at the same height as the intermediate supports 48 or metallic layers 46. Thus, by reducing the length of the conductors 16, 18 and 20, the vibration resistance of the electronic power module is increased. Preferably, the terminal connecting zone 107 is equidistant from the connecting pads 40, 50 of the power components.

Figure 7:
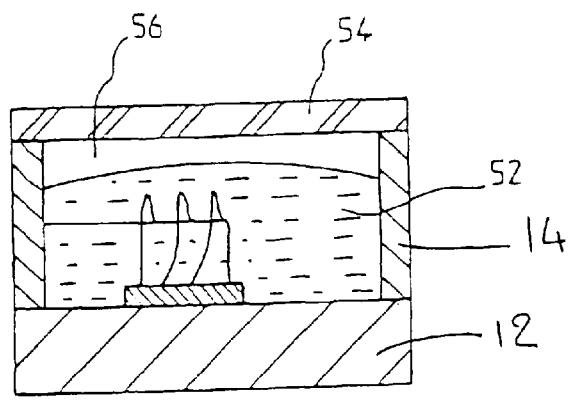
FIG. 7 is a view in cross section of a module of electronic power components according to the invention, provided with a protective cover.

With reference now to FIG. 7, the module thus produced is then encapsulated within a polymerisable flexible resin 52, for example a silicone gel, which is flowed over the module in such a way as to cover all of the electronic components carried by it, and also the wiring with which it is provided, the assembly being then covered by a protective cover 54 mounted on the base.

As can be seen in this Figure, the resin 52 preferably does not fill all of the space bounded by the module and the cover 54, so that it defines a space 56 which enables the resin 52 to expand during operation of the module.

Figure 8:
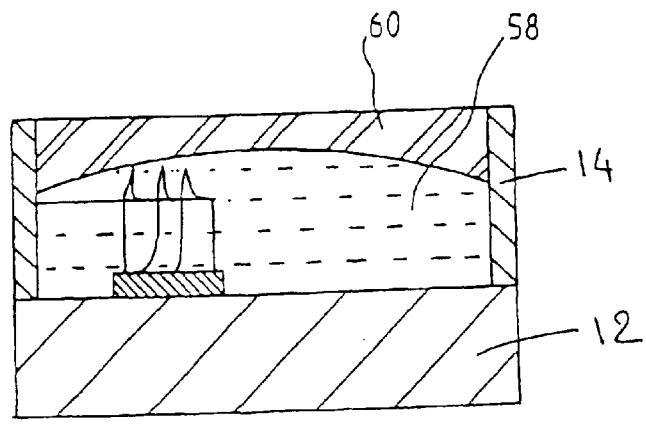
FIG. 8 is a view in cross section of a further embodiment of the module in FIG. 7.

In another version shown in FIG. 8, the encapsulation of the module is carried out using a first flexible resin 58, which is for example identical to the resin used in the embodiment described with reference to FIG. 7, in which the components as well as the conductors are encapsulated.

A rigid second resin 60, for example an epoxy resin, is deposited on the flexible resin layer 58 so as to give mechanical protection to the assembly in place of the cover.

As will be understood, the invention just described, which makes use of an electrically insulating material which is a good conductor of heat for mounting a group consisting of some of the electronic components, enables the manufacturing cost of the electronic module to be reduced because the amount of insulating material used is able to be reduced.

In addition, the assembly according to the invention enables heat given off by the components in operation to be effectively evacuated.

Finally it will be noted that the electronic module according to the invention is not limited to the embodiments described.

In this connection, although in the examples described above with reference to FIGS. 1 to 6, the conductors by which the anodes of the positive diodes and the cathodes of the negative diodes are connected to the phases of the supply source are connected to the top pads of the positive diodes, the conductors by which the cathodes of the said diodes are connected to the current output terminals are connected to the conductive top faces of the wafers.

Figure 9:
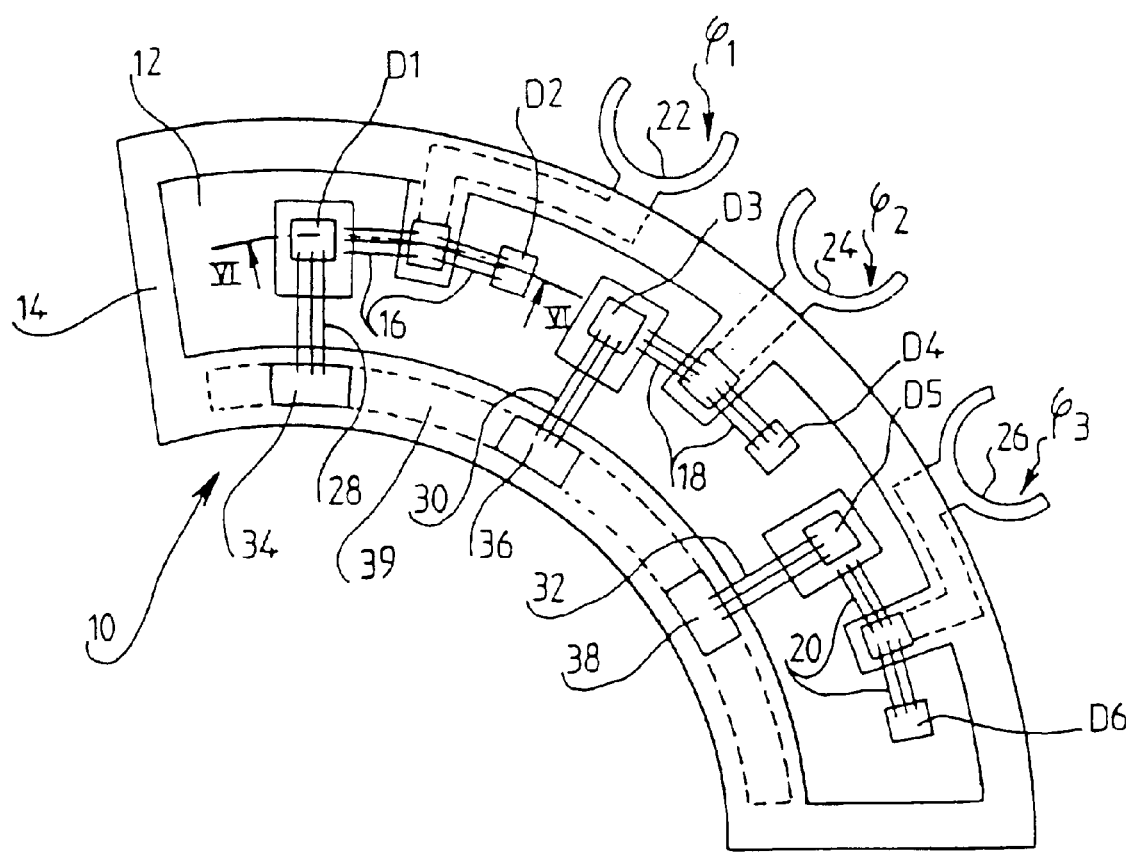
FIG. 9 shows a further version of an electronic circuit embodied in a module in accordance with the invention.

It is also possible, in another version and as can be seen in FIG. 9, to connect the positive diodes to the phases of the current source by means of conductors 16, 18 and 20 which are connected to the latter, on the one hand, and to the conductive top face of the wafer 48 or the metal layer 46, the rectified current outlet conductors 28, 30 and 32 being, for their part, connected to the output terminals 34, 36, 38 and to the top pad 40, 50 of these diodes.

Preferably, the electrically insulating and thermally conductive materials 44 will be sandwiched between two metallic layers 46, which are for example of copper or aluminium, in such a way as to constitute a sub-assembly having a coefficient of expansion which is well adapted to reduce stresses in the brazed joint.

In the drawings, the base and the frame define a housing within which the components are mounted and into which the resin 52, 58 is poured.

In FIG. 7, the cover 54 is mounted on the frame. In FIG. 8, the resin is also mounted on the frame. The frame, which is preferably of an electrically insulating material, is a protective element for the components.

What is claimed is:

1. An electronic module, comprising a metallic base (12) and electronic power components (D1, D2, D3, D4, DS, D6) mounted on the base, in which, in a group consisting of some of the components, each component is mounted on the base with a respective element (44) being interposed which is electrically insulating and thermally conductive, the other components being connected electrically to said base, further including a peripheral frame (14) mounted on the base, wherein the peripheral frame (14) incorporates interconnecting elements of electrically conductive materials, and wherein at least the face of the insulating element (44) that receives a respective component is coated with a metallic layer (46).

2. A module according to claim 1, characterised in that the metallic layer (46) placed on the face of the insulating element (44) which receives the component is connected to an electrical connecting terminal (34, 36, 38) located in line with the base.

3. An electronic module, comprising a metallic base (12) and electronic power components (D1, D2, D3, D4, D5, D6) mounted on the base, in which, in a group consisting of some of the components, each component is mounted on the base with a respective element (44) being interposed which is electrically insulating and thermally conductive, the other components being connected electrically to said base, further including a peripheral frame (14) mounted on the base, wherein the peripheral frame (14) incorporates interconnecting elements of electrically conductive materials, and wherein an intermediate support (48), of a material which is conductive to both heat and electricity, is interposed between each component of said group of some components and a respective insulating element (44).

4. A module according to claim 3, characterised in that at least the face of the element (48) that receives a component is connected to an electrical connecting terminal (34,36,38).

5. An electronic module, comprising a metallic base (12) and electronic power components (D1, D2, D3, D4, D5, D6) mounted on the base, in which, in a group consisting of some of the components, each component is mounted on the base with a respective element (44) being interposed which is electrically insulating and thermally conductive, the other components being connected electrically to said base, further including a peripheral frame (14) mounted on the base, wherein the peripheral frame (14) incorporates interconnecting elements of electrically conductive materials, and wherein the other electronic components are mounted on the base with an intermediate support (42) of electrically conductive material interposed.

6. An electronic module, comprising a metallic base (12) and electronic power components (D1, D2, D3, D4, D5, D6) mounted on the base, in which, in a group consisting of some of the components, each component is mounted on the base with a respective element (44) being interposed which is electrically insulating and thermally conductive, the other components being connected electrically to said base, further including a peripheral frame (14) mounted on the base, wherein the peripheral frame (14) incorporates interconnecting elements of electrically conductive materials, and wherein that the power components are provided with a connecting pad (40, 50) mounted on their top face, to which the conductors (16, 18, 20) are connected so as to connect the components to the remainder of the circuit of the module.

7. An electronic module, comprising a metallic base (12) and electronic power components (D1, D2, D3, D4, D5, D6) mounted on the base, in which, in a group consisting of some of the components, each component is mounted on the base with a respective element (44) being interposed which is electrically insulating and thermally conductive, the other components being connected electrically to said base, further including a peripheral frame (14) mounted on the base, wherein the peripheral frame (14) incorporates interconnecting elements of electrically conductive materials, and wherein the insulating element (44) consists of an alumina wafer, and wherein each face of the alumina wafer is coated with a metallic coating (46).

8. An electronic module, comprising a metallic base (12) and electronic power components (D1, D2, D3, D4, D5, D6) mounted on the base, in which, in a group consisting of some of the components, each component is mounted on the base with a respective element (44) being interposed which is electrically insulating and thermally conductive, the other components being connected electrically to said base, further including a peripheral frame (14) mounted on the base, wherein the peripheral frame (14) incorporates interconnecting elements of electrically conductive materials, and further comprising a protective cover (54) mounted on the peripheral frame (14), wherein the electronic components are encapsulated within a flexible protective resin (52).

9. An electronic module, comprising a metallic base (12) and electronic power components (D1, D2, D3, D4, D5, D6) mounted on the base, in which, in a group consisting of some of the components, each component is mounted on the base with a respective element (44) being interposed which is electrically insulating and thermally conductive, the other components being connected electrically to said base, further including a peripheral frame (14) mounted on the base, wherein the peripheral frame (14) incorporates interconnecting elements of electrically conductive materials, and wherein the components are encapsulated in a flexible resin (58) which is coated with a layer of rigid protective resin (60).

10. An electronic module, comprising a metallic base (12) and electronic power components (D1, D2, D3, D4, D5, D6) mounted on the base, in which, in a group consisting of some of the components, each component is mounted on the base with a respective element (44) being interposed which is electrically insulating and thermally conductive, the other components being connected electrically to said base, further including a peripheral frame (14) mounted on the base, wherein the peripheral frame (14) incorporates interconnecting elements of electrically conductive materials, and wherein the electronic power components include unclad silicon chips.

11. An electronic module, comprising a metallic base (12) and electronic power components (D1, D2, D3, D4, D5, D6) mounted on the base, in which, in a group consisting of some of the components, each component is mounted on the base with a respective element (44) being interposed which is electrically insulating and thermally conductive, the other components being connected electrically to said base, further including a peripheral frame (14) mounted on the base, wherein the peripheral frame (14) incorporates interconnecting elements of electrically conductive materials, and wherein the peripheral frame (14) is of an electrically insulating plastics material, and wherein metallic connecting arms (103, 39) are moulded into the peripheral frame (14).

12. A module according to claim 11, characterised in that the moulding-in operation provides apertures (34, 36, 38) in the peripheral frame (14), such as to define zones of electrical contact on the said metallic arms.

13. A method of assembly of an electronic module comprising electronic power components (D1, D2, D3, D4, D5, D6), which are in particular connected as a rectifier bridge for a motor vehicle alternator, on a metallic base (12), characterised in that it comprises the steps that consist of:

fixing each component between an intermediate support and electrical connecting pads;

fixing a first group of the components on the base;

fixing each component of a second group of the components on a respective element (44) which is an electrical insulator and a conductor of heat, which is coated with at least one layer (46) of electrically conductive material and which is applied on the base.

14. A method according to claim 13, characterised in that, subsequently to the fixing of the components on the base, there is fixed on the latter a peripheral frame of plastics material which incorporates electrical connecting means, and the connecting pads and the intermediate supports or the electrically conductive layer of the said element (44) are connected to the electrical connecting means of the frame.

15. A method according to claim 13, characterised in that the said electrically insulating element is coated with a layer of metallic material which is fixed on the base.

16. A method according to claim 13, characterised in that the said electrically insulating element coated with a layer of material which is electrically conductive is formed on the base by spraying an electrically insulating and thermally conductive material on the base and by depositing on the latter a layer of electrically conductive material.

17. A motor vehicle alternator comprising a rectifier bridge, a three-phase or six-phase stator, phases output from the stator being rectified by the rectifier bridge, characterised in that the rectifier bridge consists of an electronic module according to claim 1.

* * * * *